(12) United States Patent
Xie et al.

(10) Patent No.: US 11,244,864 B2
(45) Date of Patent: Feb. 8, 2022

(54) REDUCING PARASITIC CAPACITANCE WITHIN SEMICONDUCTOR DEVICES

(71) Applicant: INTERNATIONAL BUSINESS MACHINES CORPORATION, Armonk, NY (US)

(72) Inventors: Ruilong Xie, Niskayuna, NY (US); Reinaldo Vega, Mahopac, NY (US); Alexander Reznicek, Troy, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 16/854,276

(22) Filed: Apr. 21, 2020

(65) Prior Publication Data
US 2021/0327762 A1 Oct. 21, 2021

(51) Int. Cl.
| | |
|---|---|
| *H01L 21/8234* | (2006.01) |
| *H01L 29/417* | (2006.01) |
| *H01L 29/66* | (2006.01) |
| *H01L 21/02* | (2006.01) |
| *H01L 27/088* | (2006.01) |
| *H01L 21/311* | (2006.01) |
| *H01L 29/06* | (2006.01) |
| *H01L 29/10* | (2006.01) |

(52) U.S. Cl.
CPC .. *H01L 21/823425* (2013.01); *H01L 21/0217* (2013.01); *H01L 21/02167* (2013.01); *H01L 21/31111* (2013.01); *H01L 21/823437* (2013.01); *H01L 27/0886* (2013.01); *H01L 29/0673* (2013.01); *H01L 29/1037* (2013.01); *H01L 29/41725* (2013.01); *H01L 29/6656* (2013.01); *H01L 29/66545* (2013.01)

(58) Field of Classification Search
CPC ......... H01L 29/40117; H01L 21/31144; H01L 21/76224; H01L 23/5226; H01L 27/11565
See application file for complete search history.

(56) References Cited

U.S. PATENT DOCUMENTS

| | | | |
|---|---|---|---|
| 4,876,534 A | 10/1989 | Mead et al. | |
| 5,045,916 A | 9/1991 | Vor et al. | |
| 8,518,770 B2 | 8/2013 | Lin et al. | |

(Continued)

FOREIGN PATENT DOCUMENTS

| | | |
|---|---|---|
| JP | 2007317344 A | 12/2007 |
| JP | 2012209763 A | 10/2012 |

*Primary Examiner* — Zandra V Smith
*Assistant Examiner* — Andre C Stevenson
(74) *Attorney, Agent, or Firm* — Tutunjian & Bitetto, P.C.; Randall Bluestone (57) ABSTRACT

A method for fabricating a semiconductor device includes forming a shared source/drain connection at a first planar level to connect a first source/drain contact structure disposed on a first source/drain region to a second source/drain contact structure disposed on a second source/drain region, and forming a shared gate connection to connect a first gate structure to a second gate structure. The shared gate connection is formed at a second planar level different from the first planar level to reduce parasitic capacitance between the shared source/drain connection and the shared gate connection.

20 Claims, 9 Drawing Sheets

(56) References Cited

U.S. PATENT DOCUMENTS

| | | |
|---|---|---|
| 8,921,191 B2 | 12/2014 | Cai et al. |
| 8,936,986 B2 | 1/2015 | Wei et al. |
| 8,999,779 B2 | 4/2015 | Naczas et al. |
| 9,397,004 B2 | 7/2016 | Bouche et al. |
| 9,478,662 B2 | 10/2016 | Labonte et al. |
| 9,530,890 B1 | 12/2016 | Pranatharthiharan et al. |
| 9,786,737 B2 | 10/2017 | Cheng et al. |
| 2014/0203376 A1 | 7/2014 | Xie et al. |
| 2016/0233298 A1 | 8/2016 | Webb et al. |
| 2019/0295889 A1* | 9/2019 | Bai .................. H01L 21/76831 |
| 2021/0159342 A1* | 5/2021 | Asami ............... H01L 29/66742 |

* cited by examiner

REDUCING PARASITIC CAPACITANCE WITHIN SEMICONDUCTOR DEVICES

BACKGROUND

The present invention generally relates to semiconductor devices, and more particularly to reducing parasitic capacitance within semiconductor devices.

Parasitic capacitance refers to unavoidable and generally unwanted capacitance that exists between electronic device components due to proximity of the device components. For example, parasitic capacitance can particularly be a problem in high frequency circuits, and can limit the operating frequency and bandwidth of the electronic device components and circuits.

SUMMARY

In accordance with an embodiment of the present invention, a method for fabricating a semiconductor device is provided. The method includes forming a shared source/drain connection at a first planar level to connect a first source/drain contact structure disposed on a first source/drain region to a second source/drain contact structure disposed on a second source/drain region, and forming a shared gate connection to connect a first gate structure to a second gate structure. The shared gate connection is formed at a second planar level different from the first planar level to reduce parasitic capacitance between the shared source/drain connection and the shared gate connection.

In accordance with another embodiment of the present invention, a method for fabricating a semiconductor device is provided. The method includes forming a first gate structure about a first nanosheet channel structure and a second gate structure about a second nanosheet channel structure. The first and second gate structures correspond to respective portions of a gate structure layer. The method further includes forming a first source/drain contact structure on a first source/drain region and a second source/drain contact structure on a second source/drain region. The first and second source/drain contact structures correspond to respective portions of a source/drain contact structure layer. The method further includes connecting the first and second source/drain contact structures by forming a shared source/drain connection at a first planar level, and connecting the first and second gate structures by forming a shared gate connection at a second planar level different from the first planar level to reduce parasitic capacitance between the shared source/drain connection and the shared gate connection.

In accordance with yet another embodiment of the present invention, a semiconductor device is provided. The device includes a first source/drain region and a second source/drain region disposed on a substrate, a first source/drain contact structure disposed on the first source/drain region and a second source/drain contact structure disposed on the second source/drain region, a shared source/drain connection connecting the first and second source/drain contact structures at a first planar level, a first gate structure and a second gate structure disposed on the substrate, and a shared gate connection connecting the first and second gate structures at a second planar level different from the first planar level to reduce parasitic capacitance between the shared source/drain connection and the shared gate connection.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for the formation of a semiconductor device including a shared source/drain connection to connect source/drain contact structures, and a shared gate connection to connect gate structures. More specifically, the shared source/drain connection can be formed at a first planar level and the shared gate connection can be formed at a second planar level different from the first planar level to minimize overlap and reduce parasitic capacitance between the shared source/drain connection and the shared gate connection. As used herein, a planar level can refer to a processing level or height of a surface within a semiconductor device on which material has been formed. For example, the first planar level can be below the second planar level. However, such an embodiment should not be considered limiting. A planar level separation region including dielectric material can be disposed between the first and second planar levels. The planar level separation region can be selected in accordance with available space and characteristics to further reduce parasitic capacitance (e.g., between the shared source/drain connection and the shared gate connection). The embodiments described herein can be used to achieve capacitance reduction between the shared source/drain connection and the shared gate connection of, e.g., about 30%.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound. e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/". "and/or", and "at least one of", for example, in the cases of "A/B". "A and/or B" and "at least one of A and B", is intended to encompass the selection of the first listed option (A) only, or the selection of the second listed option (B) only, or the selection of both options (A and B). As a further example, in the cases of "A. B, and/or C" and "at least one of A, B. and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
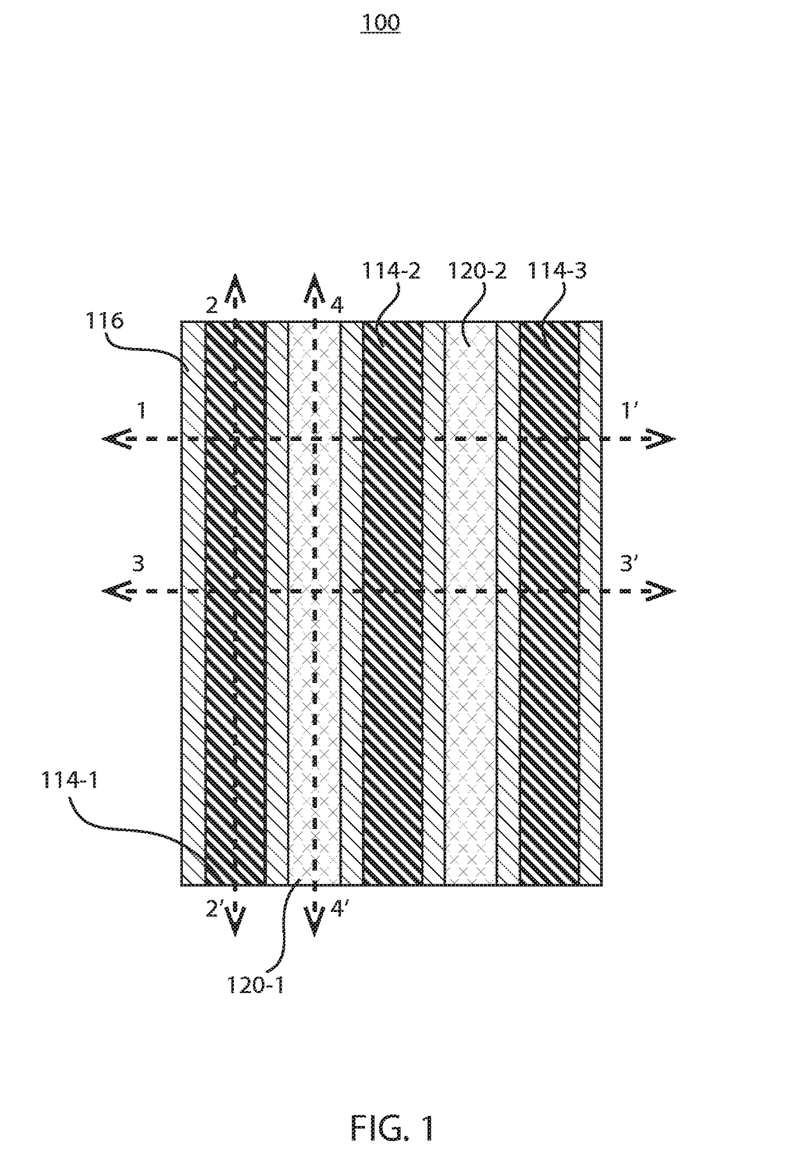
FIG. 1 is a top-down view of a base structure of a semiconductor device, in accordance with an embodiment of the present invention.
Figure 2:
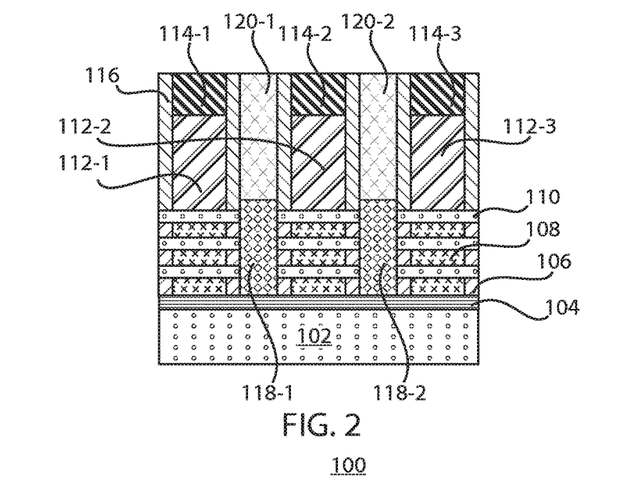
FIG. 2 is a cross-sectional view of the base structure of FIG. 1 through a first cross-section, in accordance with an embodiment of the present invention.
Figure 3:
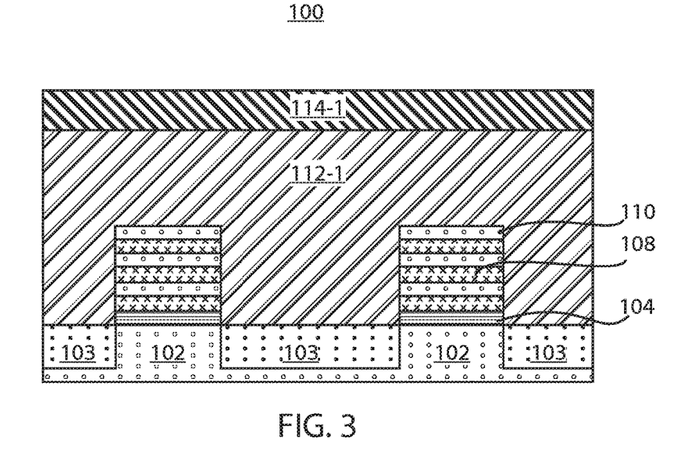
FIG. 3 is a cross-sectional view of the base structure of FIG. 1 through a second cross-section, in accordance with an embodiment of the present invention.
Figure 4:
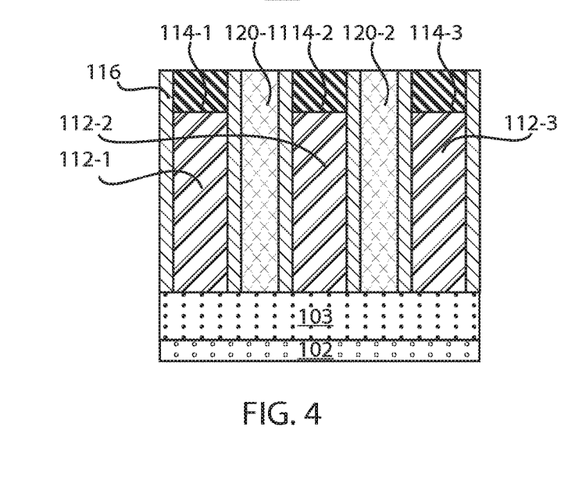
FIG. 4 is a cross-sectional view of the base structure of FIG. 1 through a third cross-section, in accordance with an embodiment of the present invention.
Figure 5:
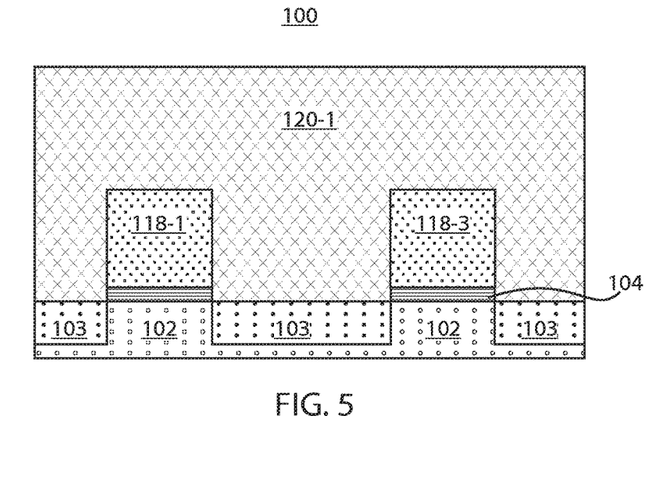
FIG. 5 is a cross-sectional view of the base structure of FIG. 1 through a fourth cross-section, in accordance with an embodiment of the present invention.

Referring now to the drawings in which like numerals represent the same or similar elements and initially to FIGS. 1-5, a base structure of a semiconductor device 100 is shown. More specifically, FIG. 1 is top-down view of the device, FIG. 2 is a cross-sectional view through line 1-1' shown in FIG. 1 (referred to herein as "the first cross-section"), FIG. 3 is a cross-sectional view through line 2-2' shown in FIG. 1 (referred to herein as "the second cross-section"), FIG. 4 is a cross-sectional view through line 3-3' shown in FIG. 1 (referred to herein as "the third cross-section"), and FIG. 5 is a cross-sectional view through line 4-4' shown in FIG. 1 (referred to herein as "the fourth cross-section").

As will be described in further detail below with reference to FIG. 20, the first cross-section will correspond to a first transverse cross-section through gate structures and source/drain connection structures, including a first source/drain contact corresponding to a first one of the source/drain connection structures. The second cross-section will correspond to a first longitudinal cross-section through a first one of the gate structures and a corresponding first gate contact of the device 100. The third cross-section will correspond to a second transverse cross-section through the first gate contact, a second gate contact corresponding to a second gate structure, and a cut region corresponding to a third gate structure of the device 100. The fourth cross-section will correspond to a second longitudinal cross-section through the first shared source/drain connection structure, the first source/drain contact and a second source/drain contact corresponding to the first silicide structure.

As shown, the base structure includes a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide.

As further shown, the base structure can further include shallow trench isolation (STI) regions 103 and isolation material 104 disposed on the substrate 102. The STI regions 103 and the isolation material 104 can include any suitable dielectric material in accordance with the embodiments described herein. For example, the STI regions 103 can include. e.g., silicon dioxide ($SiO_2$) or other suitable dielectric material. Examples of materials that can be used to form the isolation material 104 include, but are not limited to, $SiO_2$, silicon nitride (e.g., SiN), etc.

As further shown, the base structure can further include a plurality of channel structures disposed on the isolation material 104. More specifically, in this illustrative embodiment, each of the plurality of channel structures can include a stack of alternating first semiconductor layers 108 and second semiconductor layers 110, with inner spacers 106 abutting ends of the first layers 108. The first and second semiconductor layers 108 and 110 can include nanosheets, such that each channel structure is a nanosheet channel structure. A nanosheet refers to a nanostructure with a thickness in a scale ranging from, e.g., about 1 nm to about 100 nm.

The inner spacers 106 can include any suitable dielectric material in accordance with the embodiments described herein. For example, the inner spacers 106 can include, e.g., silicon nitride (e.g., SiN) or other suitable dielectric material.

The first and second semiconductor layers 108 and 110 can include any suitable materials in accordance with the embodiments described herein. For example, the first semiconductor layers 108 can include, e.g., silicon-germanium (SiGe) and the second semiconductor layers 110 can include, e.g. Si. However, such an embodiment should not be considered limiting.

It should be noted that the embodiments described herein are directed to a nanosheet semiconductor device context for illustrative purposes only. However, aspects of the present invention cam be applied to any suitable semiconductor device structures in which parasitic capacitance between a shared source/drain connection and a shared gate connection can be an issue. For example, other embodiments can include finFETs and still others planar devices, etc. where such parasitic capacitance is an issue.

As further shown, the base structure includes a plurality of sacrificial or dummy gate structures including a plurality of sacrificial or dummy gates 112-1 through 112-3 disposed on respective ones of the plurality of channel structures, and a plurality of cap layers 114-1 through 114-3 disposed on respective ones of the plurality of dummy gates 112-1 through 112-3. As will be described in further detail below with reference to FIGS. 6-10, the dummy gate structures will be replaced with a functional gate structure having a gate conductor and a gate dielectric during a replacement metal gate (RMG) process.

The plurality of dummy gates 112-1 through 112-3 can include any suitable material in accordance with the embodiments described herein. For example, the plurality of dummy gates 112-1 through 112-3 can include, e.g., a thin layer of $SiO_2$ and/or polysilicon material, or other suitable materials or combinations of materials.

The plurality of cap layers 114-1 through 114-3 can include any suitable material in accordance with the embodiments described herein. In one embodiment, the plurality of cap layers 114-1 through 114-3 can include silicon nitride (e.g., SiN), $SiO_2$, a combination of layers of SiN and $SiO_2$, or other suitable hardmask materials or combinations of hardmask materials.

As further shown, the base structure further includes a plurality of source/drain regions 118-1 through 118-3 disposed on the isolation material 104, a plurality of interlevel dielectric (ILD) layers 120-1 and 120-2 disposed on respective ones of the plurality of source/drain regions 118-1 through 118-3, and spacer material 116 disposed on the plurality of channel structures and sidewalls of the plurality of dummy gates 112-1 through 112-3 and the plurality of cap layers 114-1 through 114-3. The spacer material 116 separates the plurality of dummy gate structures from the plurality of source/drain regions 118-1 and 118-2 and the plurality of ILD layers 120-1 and 120-2.

In one embodiment, the plurality of source/drain regions 118-1 through 118-3 can be epitaxial layers formed by epitaxially growth. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The plurality of ILD layers 120-1 and 120-2 can include any suitable dielectric material in accordance with the embodiments described herein. For example, the plurality of ILD layers 120-1 and 120-2 can include, e.g., silicon dioxide ($SiO_2$) or other suitable dielectric material.

Any suitable processes can be used to form the base structure in accordance with the embodiments described herein.

As will be described in further detail below with reference to FIGS. 6-20, the base structure of the device 100 will be processed to form at least first and second source/drain contact structures disposed on respective source/drain regions, and at least first and second gate structures. Then, at least one shared source/drain connection will be formed to connect the first and second source/drain contact structures, and at least one shared gate connection will be formed to connect the first and second gate structures. More specifically, the at least one shared source/drain connection and the at least one shared gate connection will be formed at different planar levels to reduce parasitic capacitance between the at least one shared source/drain connection and the at least one shared gate connection.

Figure 6:
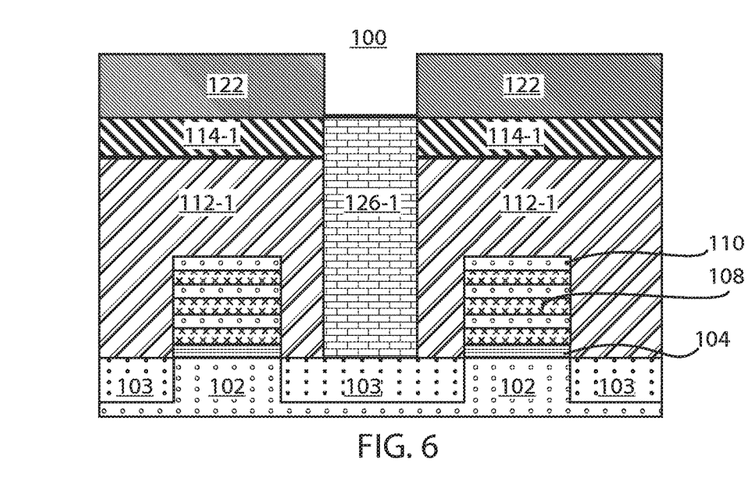
FIG. 6 is a cross-sectional view of the formation of first and second dielectric material through the second cross-section during the fabrication of the device, in accordance with an embodiment of the present invention.
Figure 7:
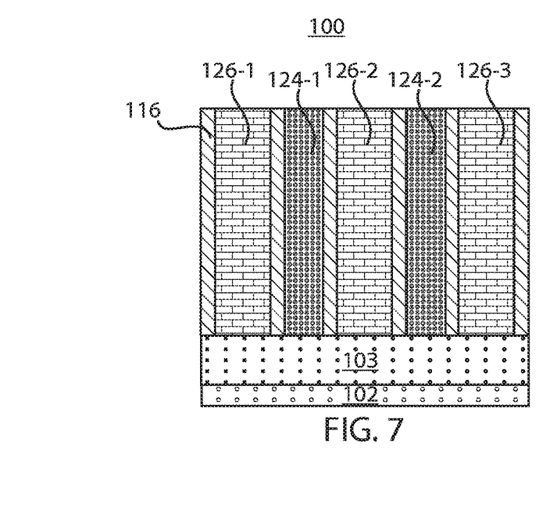
FIG. 7 is a cross-sectional view of the formation of first and second dielectric material through the third cross-section during the fabrication of the device, in accordance with an embodiment of the present invention.
Figure 8:
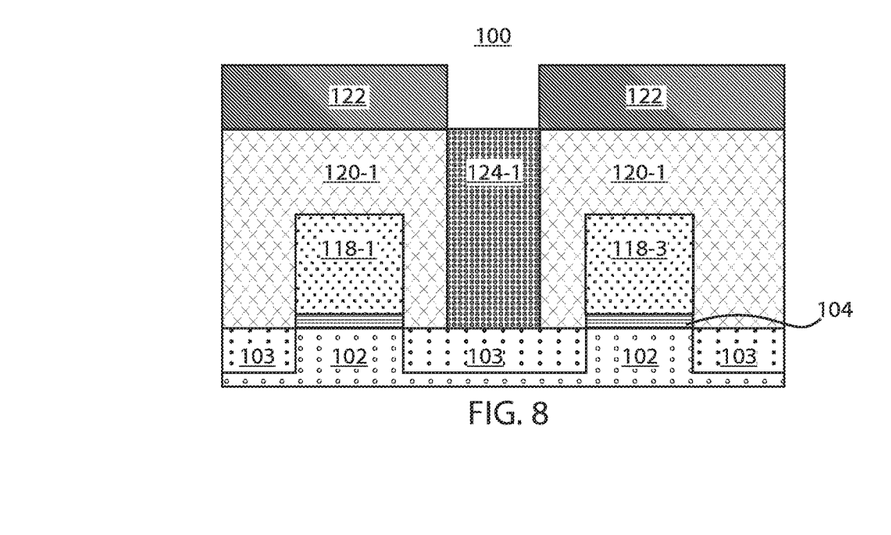
FIG. 8 is a cross-sectional view of the formation of first and second dielectric material through the fourth cross-section during the fabrication of the device, in accordance with an embodiment of the present invention.

With reference to FIGS. 6-8, the base structure is processed using a mask 122 to form first dielectric layers 124-1 and 124-2 and second dielectric layers 126-1 through 126-3. More specifically, FIG. 6 is a cross-sectional view through the second cross-section, FIG. 7 is a cross-sectional view through the third cross-section and FIG. 8 is a cross-sectional view through the fourth cross-section.

The mask 122 can be formed as a global cut mask above the plurality of channel structures. Although the cross-sectional view through the first cross-section is not shown, the mask 122 can be formed across the spacer material 116, the plurality of cap layers 114-1 through 114-3 and the plurality of ILD layers 120-1 and 120-2 as viewed through the first cross-section. The mask 122 can include any suitable lithography material in accordance with the embodiments described herein. For example, the mask 122 can include, e.g., an organic planarization layer (OPL) and/or other suitable materials or combinations of materials.

Forming the first dielectric layers 124-1 and 124-2 as shown in FIGS. 6-8 can include performing an ILD cut by etching through portions of the ILD layers 120-1 and 120-2 based on the mask 122 to form trenches between pairs of the source/drain regions exposing the STI region 103 (e.g., between the source/drain regions 118-1 and 118-3 as shown in FIG. 8), forming first dielectric material within the trenches, and etching back the first dielectric material to form the first dielectric layers 124-1 and 124-2. Although not shown, portions of the ILD layers 120-1 and 120-2 with the region corresponding to the first cross-section remain unetched due to the mask 122.

Forming the second dielectric layers 126-1 through 126-3 as shown in FIGS. 6-8 can further include performing a gate cut by etching through portions the plurality of dummy gate structures based on the mask 122 to form trenches between pairs of the channel structures (e.g., as shown in FIG. 6), forming second dielectric material within the trenches, and etching back the second dielectric material to form the second dielectric layers 126-1 through 126-3.

The first dielectric layers 124-1 and 124-2 and the second dielectric layers 126-1 through 126-3 can include any suitable dielectric materials in accordance with the embodiments described herein. More specifically, as will be described in further detail below, the first dielectric material and the second dielectric material are selected to support etching of the first dielectric material selective to the second dielectric material.

For example, in one embodiment, the first dielectric layers 124-1 and 124-2 can include silicon carbide (SiC) and the second dielectric layers 126-1 through 126-3 can include silicon nitride (e.g., SiN). However, such an embodiment should not be considered limiting. The second dielectric layers 126-1 through 126-3 can include the same material as the plurality of cap layers 114-1 through 114-3.

Figure 9:
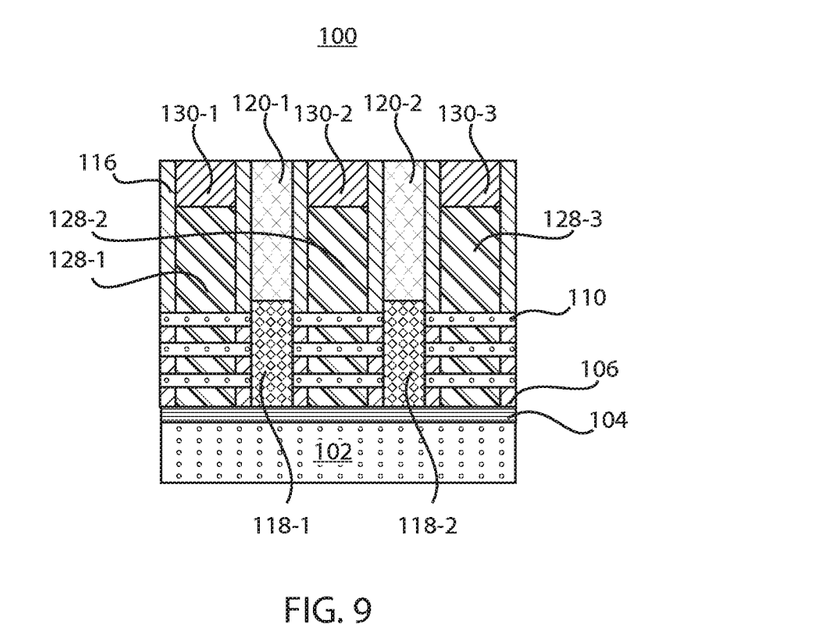
FIG. 9 is a cross-sectional view of dummy gate removal, channel release and the formation of a replacement metal gate (RMG) through the first cross-section during the fabrication of the device, in accordance with an embodiment of the present invention.
Figure 10:
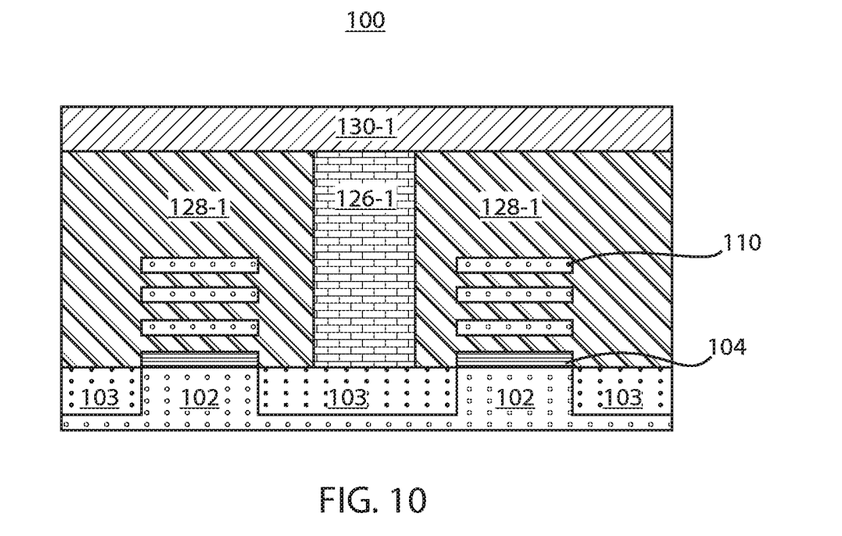
FIG. 10 is a cross-sectional view of the dummy gate removal, channel release and formation of the RMG through the second cross-section during the fabrication of the device, in accordance with an embodiment of the present invention.

With reference to FIGS. 9 and 10, after removing the second semiconductor layers 108 using a channel release process, a replacement metal gate (RMG) process is performed to replace the dummy gate structures with gate structure layers 128-1 through 128-3 formed in a traverse direction with respect to the second semiconductor layers 110. More specifically. FIG. 9 is a cross-sectional view through the first cross-section and FIG. 10 is a cross-sectional view through the second cross-section.

The gate structure layers 128-1 through 128-3 can include any suitable materials in accordance with the embodiments described herein. More specifically, the gate structure layers 128-1 through 128-3 can include a gate dielectric and a gate conductor.

In one embodiment, the gate structure layers 128-1 through 128-3 can include a high-k metal gate (HKMG) material. HKMG material includes a high-k dielectric material as the gate dielectric and a metal gate as the gate conductor (as opposed to a polysilicon gate). A high-k dielectric material is one that has a dielectric constant k greater than the dielectric constant of $SiO_2$ at room temperature (e.g., about 20° C.-25° C.) and atmospheric pressure (e.g., about 1 atm). For example, a high-k dielectric material can have a dielectric constant of greater than about 3.9. Examples of high-k dielectric materials that can be used include, but are not limited to, hafnium silicate ($HfO_4Si$), zirconium silicate ($ZrSiO_4$), hafnium dioxide ($HfO_2$) and zirconium dioxide ($ZrO_2$). Examples of materials that can be used as the gate conductor include work function metals including, but not limited to, titanium nitride (TiN), titanium aluminum carbide (TiAlC), titanium carbide (TiC), tantalum nitride (TaN), etc., and bulk metal gate materials that can include, but are noted limit to, tungsten (W), aluminum (Al), etc. A planarization process (e.g., chemical-mechanical planarization (CMP)) is done after the formation of the HKMG materials, followed by HKMG material recess.

As further shown, cap layers 130-1 through 130-3 are formed on respective ones of the gate structure layers 128-1 through 128-3. The cap layers 130-1 through 130-3 can include any suitable material in accordance with the embodiments described herein. For example, the cap layers 130-1 through 130-3 can include, e.g., silicon nitride (e.g., SiN). However, such an embodiment should not be considered limiting.

Figure 11:
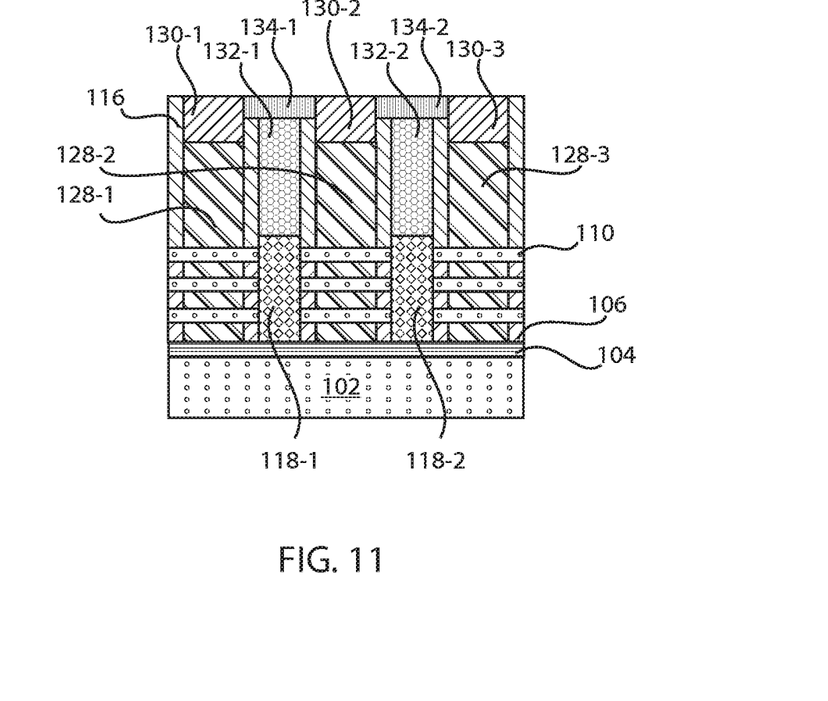
FIG. 11 is a cross-sectional view of source/drain contact structure formation through the first cross-section during the fabrication of the device, in accordance with an embodiment of the present invention.
Figure 12:
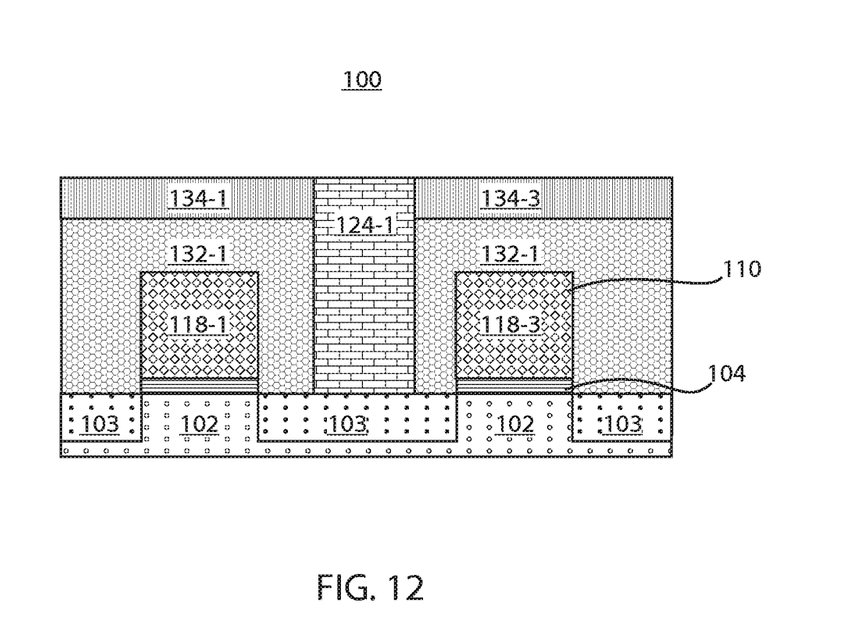
FIG. 12 is a cross-sectional view of the source/drain contact structure formation through the fourth cross-section during the fabrication of the device, in accordance with an embodiment of the present invention.

With reference to FIGS. 11 and 12, the ILD layers 120-1 and 120-2 are removed and replaced with a plurality of source/drain contact structure layers 132-1 and 132-2 formed in a transverse direction with respect to the plurality of second semiconductor layers 110, and a plurality of cap layers 134-1 and 134-2 disposed on the plurality of source/drain contact structure layers 132-1 and 132-2. More specifically, FIG. 11 is a cross-sectional view through the first cross-section and FIG. 12 is a cross-sectional view through the fourth cross-section. Any suitable processes can be used to remove the ILD layers 120-1 and 120-2 and form the plurality of source/drain contact structure layers 132-1 and 132-2 and the plurality of cap layers 134-1 and 134-2 in accordance with the embodiments described herein.

The source/drain contact structure layers 132-1 and 132-2 can include any suitable conductive material in accordance with the embodiments described herein. For example, the source/drain contacts structure layers 132-1 and 132-2 can include, e.g., a silicide. A silicide is a conducting film including a conductive material (e.g., metal) and silicon, and can provide high-temperature stability with metal-like resistivity. Examples of silicides that can be used to form the silicide structure layers 132-1 and 132-2 include, but are not limited to, a titanium silicide (e.g., $TiSi_2$), a cobalt silicide (e.g., $CoSi_2$), a tungsten silicide (e.g., $WSi_2$), a nickel silicide (e.g., NiSi), a platinum silicide (e.g., PtSi), etc. Over the silicide, contact material can be formed including a suitably thin adhesion layer including, e.g., TiN, TaN or other suitable material, followed by bulk metal fill including, e.g., W, Al, Co, Ru or other suitable material.

After the source/drain contact materials are planarized (e.g., using CMP), a selective metal recess process can be performed to form trenches, and the plurality of cap layers 134-1 and 134-2 can be formed within the trenches. The plurality of cap layers 134-1 and 134-2 can include any suitable dielectric material in accordance with the embodiments described herein. For example, the plurality of cap layers 134-1 and 134-2 can include, e.g., $SiO_2$. However, such an embodiment should not be considered limiting.

As further shown in FIG. 12, a first source/drain contact structure is formed on the source/drain region 118-1, and a second source/drain contact structure is formed on the source/drain region 118-1. In this illustrative embodiment, the first and second source/drain contact structures correspond to respective portions of the same source/drain contact structure layer 132-1. However, in other embodiments, the first and second source/drain contact structures can correspond to different source/drain contact structure layers.

Figure 13:
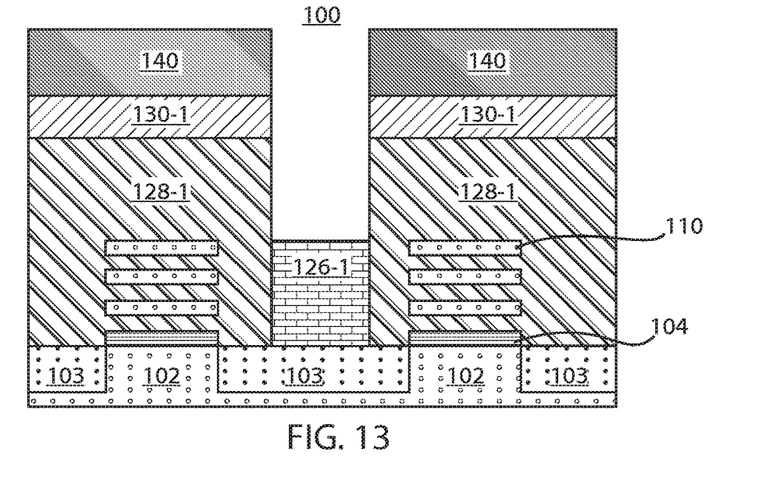
FIG. 13 is a cross-sectional view of the formation of a shared source/drain connection, gate patterning and dielectric material etch back through the second cross-section during the fabrication of the device, in accordance with an embodiment of the present invention.
Figure 14:
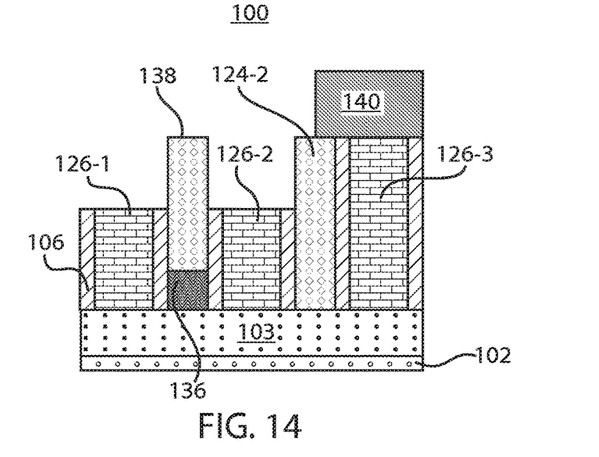
FIG. 14 is a cross-sectional view of the formation of the shared source/drain connection, gate patterning and dielectric material etch back through the third cross-section during the fabrication of the device, in accordance with an embodiment of the present invention.
Figure 15:
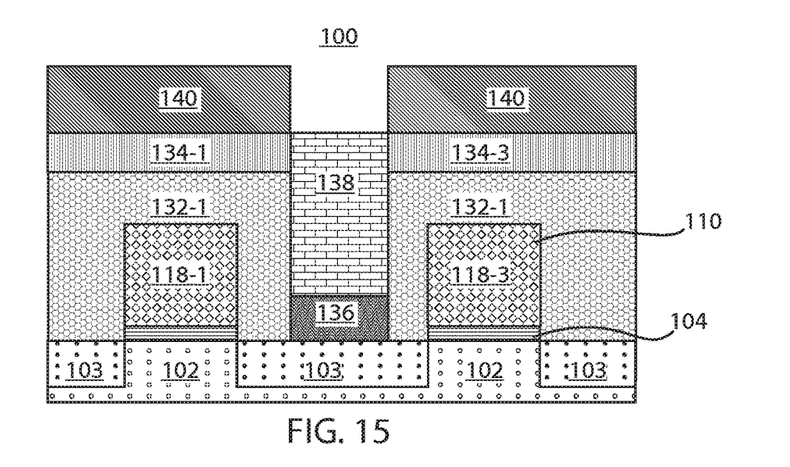
FIG. 15 is a cross-sectional view of the formation of the shared source/drain connection, gate patterning and dielectric material etch back through the fourth cross-section during the fabrication of the device, in accordance with an embodiment of the present invention.

With reference to FIGS. 13-15, processing is performed to replace the dielectric layer 124-1 with at least one shared source/drain connection 136 at a first planar level formed to connect the first and second source/drain contact structures, and to prepare the device 100 for the formation of at least one shared gate connection at a second planar level different from the first planar level.

More specifically. FIG. 13 is a cross-sectional view through the second cross-section, FIG. 14 is a cross-sectional view through the third cross-section and FIG. 15 is a cross-sectional view through the fourth cross-section.

Performing the processing shown in FIGS. 13-15 can include forming the shared source/drain connection 136 by forming a first mask (not shown) including a gap exposing the dielectric layer 124-1, etching the dielectric layer 124-1 selective to the dielectric layers 126-1 through 126-3 and the plurality of cap layers 134-1 and 134-2 based on the first mask to form a first opening, removing the first mask, filling the first opening with first conductive material, and recessing the first conductive material to form the shared source/drain connection 136 such that only the bottom portion of the first conductive material is preserved to provide the desired connection between the first and second source/drain contact structures.

The first mask can include any suitable material in accordance with the embodiments described herein. For example, the first mask can include, e.g., an OPL and/or other suitable materials or combinations of materials.

The shared source/drain connection 136 can include any suitable materials in accordance with the embodiments described herein. Examples of suitable materials that can be used to form the shared source/drain connection 136 include, but are not limited to, copper (Cu), cobalt (Co), tantalum (Ta), ruthenium (Ru), titanium (Ti), tungsten (W), etc. The shared source/drain connection 136 can further include a suitably thin adhesion layer including, e.g., TiN or other suitable material.

Performing the processing shown in FIGS. 13-15 can further include forming a dielectric layer 138 on the shared source/drain connection 136. The dielectric layer 138 can include the same material as the dielectric layer 124-1 (e.g., SiC). However, such an embodiment should not be considered limiting.

Performing the processing shown in FIGS. 13-15 can further include forming a second mask, mask 140, and patterning the at least one shared gate connection described in further detail below with reference to FIGS. 16-19. More specifically, the mask 140 includes gaps exposing the dielectric layers 126-1 and 126-2 for subsequent etching. The mask 140 can include any suitable material in accordance with the embodiments described herein. For example, the mask 140 can include, e.g., an OPL and/or other suitable materials or combinations of materials.

Performing the processing shown in FIGS. 13-15 can further include etching the dielectric layers 126-1 and 126-2 and portions of the spacer material 116 along the dielectric layers 126-1 and 126-2 based on the mask 140. As shown, the etching is selective to the material of the dielectric layers 124-2 and 138 (e.g., SiC). The etching results in the formation of contact opening.

Figure 16:
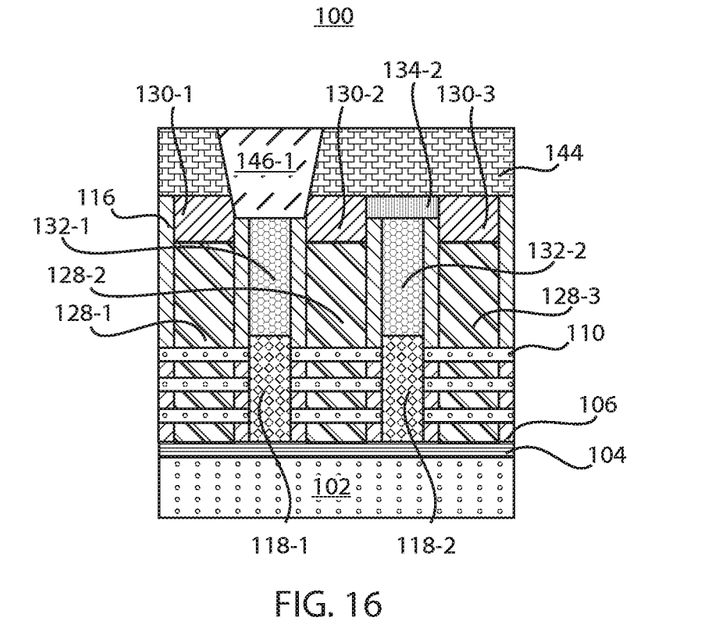
FIG. 16 is a cross-sectional view of contact formation through the first cross-section during the fabrication of the device, in accordance with an embodiment of the present invention.
Figure 17:
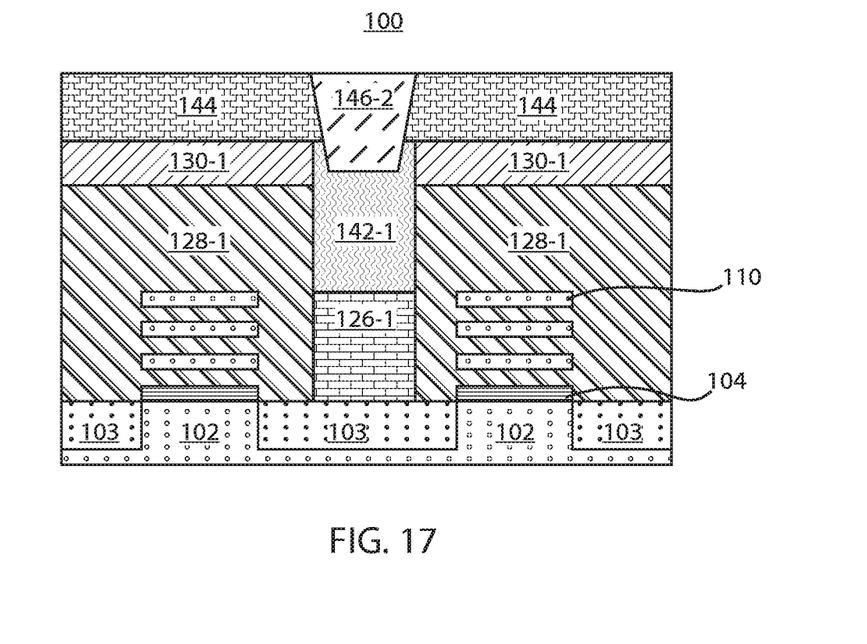
FIG. 17 is a cross-sectional view of the contact formation through the second cross-section during the fabrication of the device, in accordance with an embodiment of the present invention.
Figure 18:
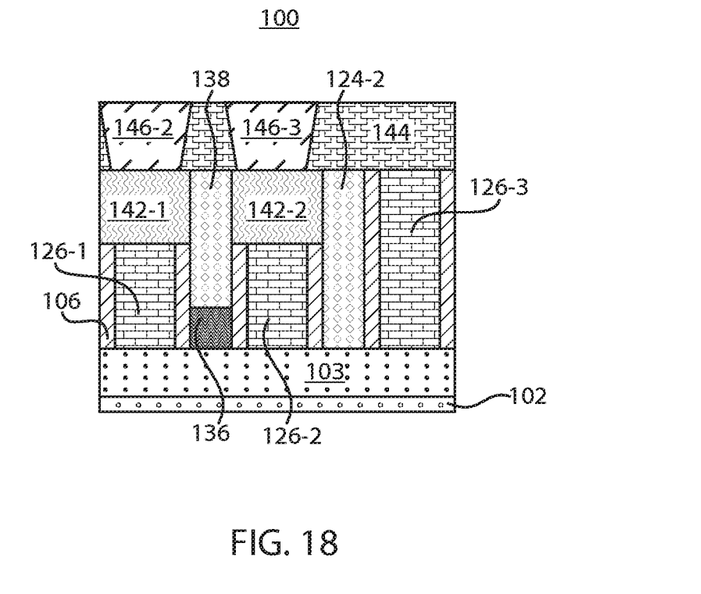
FIG. 18 is a cross-sectional view of the contact formation through the third cross-section during the fabrication of the device, in accordance with an embodiment of the present invention.
Figure 19:
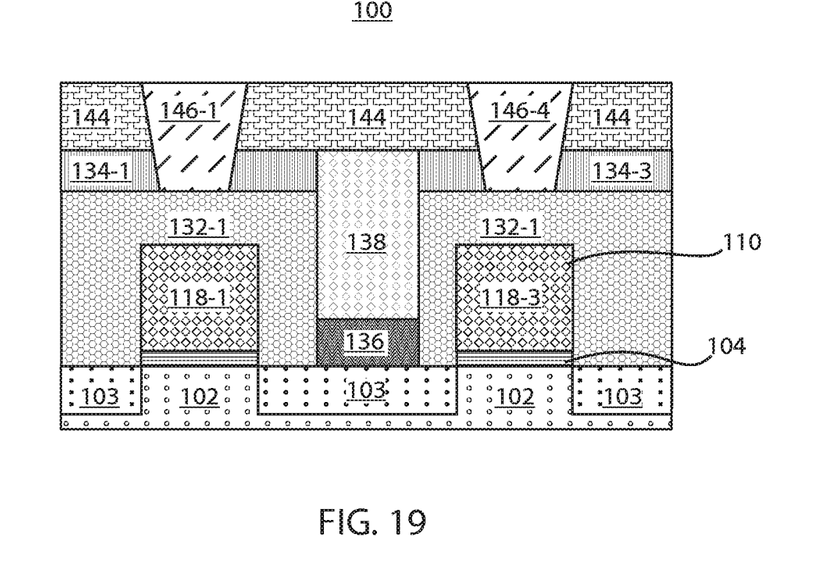
FIG. 19 is a cross-sectional view of the contact formation through the fourth cross-section during the fabrication of the device, in accordance with an embodiment of the present invention.

With reference to FIGS. 16-19, a plurality of gate connections 142-1 and 142-2 are formed on respective ones of the dielectric layers 126-1 and 126-2, and a plurality of contacts including contacts 146-1 through 146-4 are formed through an ILD layer 144. More specifically, FIG. 16 is a cross-sectional view through the first cross-section, FIG. 17 is a cross-sectional view through the second cross-section, FIG. 18 is a cross-sectional view through the third cross-section and FIG. 19 is a cross-sectional view through the fourth cross-section.

As further shown in FIG. 17, the gate connection 142-1 is a shared gate connection between a first gate structure and a second gate structure at a planar level above the shared source/drain connection 136 to reduce parasitic capacitance. For example, in this illustrative embodiment, the first gate structure corresponds to a first portion of the gate structure layer 128-1 and the second gate structure corresponds to a second portion of the gate structure layer 128-1. However, in other embodiments, the first and second gate structures can be formed from different gate structure layers.

The plurality of gate connections 142-1 and 142-2 can include any suitable material in accordance with the embodiments described herein. Examples of suitable materials that can be used to form the plurality of gate connections 142-1 and 142-2 include, but are not limited to, copper (Cu), cobalt (Co), tantalum (Ta), ruthenium (Ru), titanium (Ti), tungsten (W), etc, with any suitable adhesion liner, if needed (e.g., TiN or other suitable material).

The dielectric layer 138 disposed on the shared source/drain connection 136 and the dielectric layer 126-1 disposed underneath the gate connection 142-1 can correspond to at least a portion of a planar level separation region disposed between the first and second planar levels. The planar level separation region can be selected in accordance with available space and the capacitive characteristic to further reduce parasitic capacitance (e.g., between the shared source/drain connection 136 and the gate connection 142-1).

The ILD layer 144 can include any suitable dielectric material in accordance with the embodiments described herein. For example, the ILD layer 144 can include, e.g., $SiO_2$ or other suitable dielectric materials.

The plurality of contacts including contacts 146-1 through 146-4 can be formed by etching contact holes within the ILD layer 144 to expose respective ones of the first source/drain contact structure (e.g., the first portion of the source/drain contact structure layer 132-1), the gate connection 142-1, the gate connection 142-2, and the second source/drain contact structure (e.g., the second portion of the source/drain contact structure 132-1).

The plurality of contacts can include any suitable material in accordance with the embodiments described herein. Examples of suitable materials that can be used to form the plurality of contacts 146-1 through 146-4 include, but are not limited to, copper (Cu), cobalt (Co), tantalum (Ta), ruthenium (Ru), titanium (Ti), tungsten (W), etc., with any adhesion liner, if needed (e.g., TiN or other suitable material).

Although not shown in FIGS. 16-19, the plurality of contacts can further include an additional contact disposed on the source/drain contact structure 132-2, and another additional contact disposed on an additional source/drain contact structure (not shown). Further details regarding these additional contacts and the additional silicide structure will now be described below with reference to FIG. 20.

Figure 20:
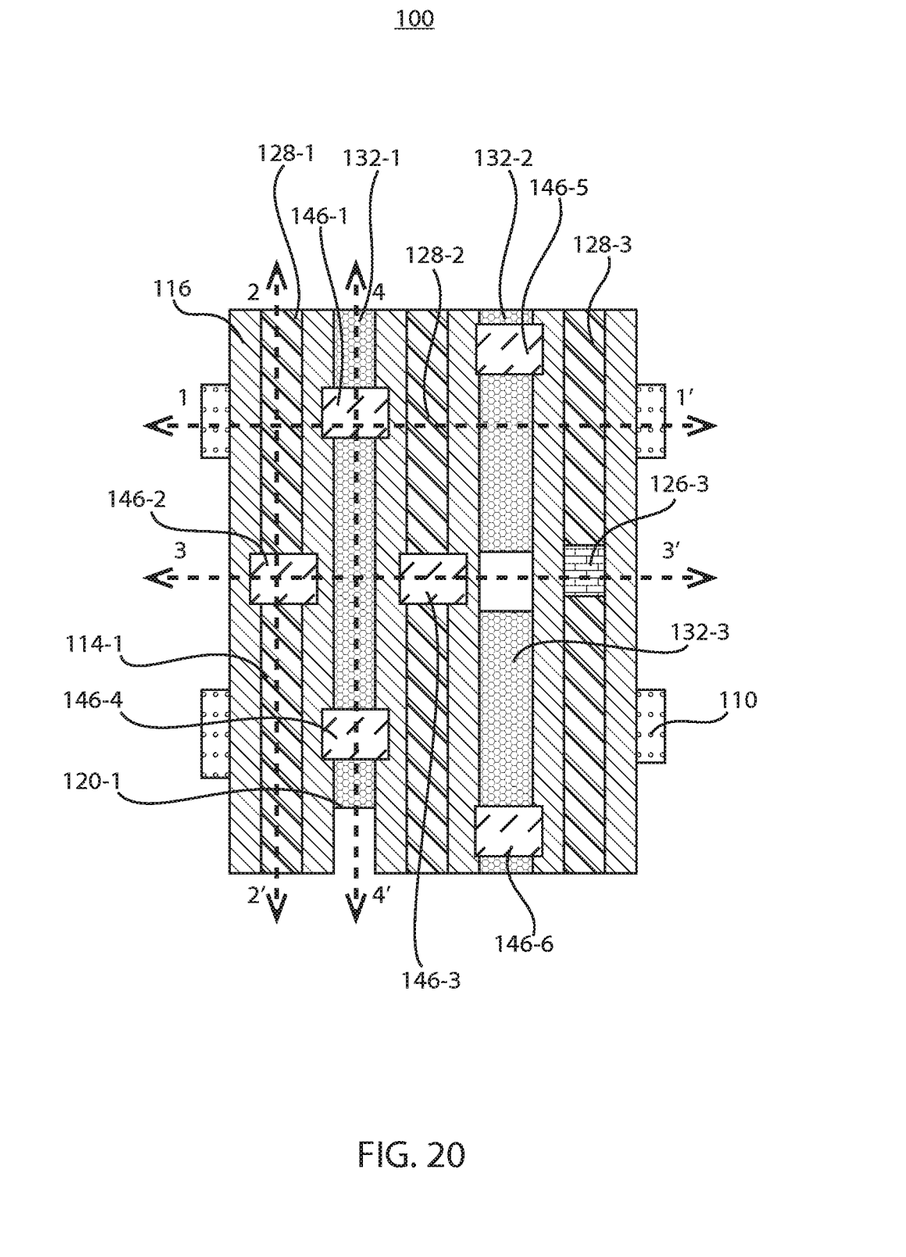
FIG. 20 is a top-down view of the contact formation during the fabrication of the device, in accordance with an embodiment of the present invention.

With reference to FIG. 20, a top-down view of the device 100 is provided. In order to show the arrangement of the gate structure layers 128-1 through 128-3 and the source/drain contact structure layers 132-1 and 132-2 with respect to the semiconductor layers 110, components 124, 126-1 and 126-2, 130, 134, 138, 142 and 144 have been omitted from view. Dielectric layer 126-3 is shown to represent a cut region of the device 100.

As further shown, the device 100 can further include an additional source/drain contact structure layer 132-3. Moreover, in addition to the contacts 146-1 through 146-4, the device 100 can further include a contact 146-5 disposed on the source/drain contact structure layer 132-2 and a contact 146-6 disposed on the source/drain contact structure layer 132-3.

The embodiments described here above with reference to FIGS. 1-20 provide for the formation of a semiconductor device including a shared source/drain connection formed at a planar level different from a planar level of a shared gate connection to reduce parasitic capacitance between the shared source/drain connection and the shared gate connection. For example, in accordance with these illustrative embodiments, the planar level of the shared source/drain connection can be below or beneath the planar level of the shared gate connection. However, another embodiment, the shared source/drain connection can be formed at a planar level above that of the shared gate connection. Accordingly, it is to be understood and appreciated that the illustrative embodiments described herein should not be considered limiting.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a shared source/drain connection directly contacting sidewalls of a first source/drain contact structure and directly contacting sidewalls of a second drain/source contact structure, the shared source/drain connection formed on a first planar level; and
    forming a shared gate connection to connect a first gate structure to a second gate structure, the shared gate connection being formed at a second planar level different from the first planar level to reduce parasitic capacitance between the shared source/drain connection and the shared gate connection.

2. The method of claim 1, wherein the first planar level is below the second planar level.

3. The method of claim 1, further comprising:
    forming, within an interlevel dielectric (ILD) layer, a first dielectric layer between the first and second source/drain regions;
    forming, within a dummy gate, a second dielectric layer between a first channel structure and a second channel structure, the first and second dielectric layers including different materials to support selective etching between the different materials;
replacing the dummy gate with a gate structure layer including the first and second gate structures; and
after removing the ILD layer, forming a gate contact structure layer including the first and second source/drain contact structures.

4. The method of claim 3, wherein the first dielectric layer includes silicon carbide and the second dielectric layer includes silicon nitride.

5. The method of claim 3, wherein forming the shared source/drain connection further includes:
removing the first dielectric layer selective to the second dielectric to form an opening;
filling the opening with a conductive material; and
recessing the conductive material to form the shared source/drain connection at the first planar level between the first and second source/drain contact structures.

6. The method of claim 3, wherein forming the shared gate connection further includes:
forming a third dielectric layer on the shared source/drain connection to separate the first and second source/drain contact structures, the third dielectric layer including a different material from the second dielectric layer to support selective etching between the second and third dielectric materials;
etching back the second dielectric layer selective to the third dielectric layer to form an opening;
filling the opening with a conductive material; and
recessing the conductive material to form the shared gate connection at the second planar level between the first and second gate structures.

7. The method of claim 1, further comprising:
forming a first source/drain contact on the first source/drain contact structure;
forming a second source/drain contact on the second source/drain contact structure; and
forming a gate contact on the shared gate connection.

8. The method of claim 1, wherein the first and second gate structures are disposed about respective first and second nanosheet channel structures.

9. A method for fabricating a semiconductor device, comprising:
forming a first gate structure about a first nanosheet channel structure and a second gate structure about a second nanosheet channel structure, the first and second gate structures corresponding to respective portions of a gate structure layer;
forming a first source/drain contact structure on a first source/drain region and a second source/drain contact structure on a second source/drain region, the first and second source/drain contact structures corresponding to respective portions of a source/drain contact structure layer;
connecting the first and second source/drain contact structures by forming a shared source/drain connection at a first planar level, the shared source/drain connection directly contacting sidewalls of the first source/drain contact structure and directly contacting sidewalls of the second drain/source contact structure; and
connecting the first and second gate structures by forming a shared gate connection at a second planar level different from the first planar level to reduce parasitic capacitance between the shared source/drain connection and the shared gate connection.

10. The method of claim 9, wherein the first planar level is below the second planar level.

11. The method of claim 9, further comprising:
forming, within an interlevel dielectric (ILD) layer, a first dielectric layer between the first and second source/drain regions;
forming, within a dummy gate, a second dielectric layer between the first and second nanosheet channel structures, the first and second dielectric layers including different materials to support selective etching between the different materials;
replacing the dummy gate with the gate structure layer; and
after removing the ILD layer, forming the gate contact structure layer.

12. The method of claim 11, wherein the first dielectric layer includes silicon carbide and the second dielectric layer includes silicon nitride.

13. The method of claim 11, wherein connecting the first and second portions of the source/drain contact structure by forming the shared source/drain connection at the first planar level further includes:
removing the first dielectric layer selective to the second dielectric to form an opening;
filling the opening with a conductive material; and
recessing the conductive material to form the shared source/drain connection at the first planar level between the first and second source/drain contact structures.

14. The method of claim 11, wherein connecting the first and second portions of the gate structure by forming the shared gate connection at the second planar level further includes:
forming a third dielectric layer on the shared source/drain connection to separate the first and second source/drain contact structures, the third dielectric layer including a different material from the second dielectric layer to support selective etching between the second and third dielectric materials;
etching back the second dielectric layer selective to the third dielectric layer to form an opening;
filling the opening with a conductive material; and
recessing the conductive material to form the shared gate connection at the second planar level between the first and second gate structures.

15. The method of claim 9, further comprising:
forming a first source/drain contact on the first source/drain contact structure;
forming a second source/drain contact on the second source/drain contact structure; and
forming a gate contact on the shared gate connection.

16. A semiconductor device, comprising:
a first source/drain region and a second source/drain region disposed on a substrate;
a first source/drain contact structure disposed on the first source/drain region and a second source/drain contact structure disposed on the second source/drain region;
a shared source/drain connection connecting the first and second source/drain contact structures at a first planar level, the shared source/drain connection directly contacting sidewalls of the first source/drain contact structure and directly contacting sidewalls of the second drain/source contact structure;
a first gate structure and a second gate structure disposed on the substrate; and
a shared gate connection connecting the first and second gate structures at a second planar level different from the first planar level to reduce parasitic capacitance between the shared source/drain connection and the shared gate connection.

17. The device of claim 16, wherein the first and second gate structures are disposed about respective first and second nanosheet channel structures.

18. The device of claim 16, wherein the first planar level is below the second planar level.

19. The device of claim 18, further comprising:
- a first dielectric layer including a first material above the shared source/drain connection; and
- a second dielectric layer underneath the shared gate connection, the first and second dielectric layers including different materials selected to support selective etching between the different materials.

20. The device of claim 18, further comprising:
- a first source/drain contact and a second source/drain contact disposed on respective ones of the first and second source/drain contact structures; and
- a gate contact disposed on the shared gate connection.

* * * * *